(12) United States Patent
Saito

(10) Patent No.: US 12,230,627 B2
(45) Date of Patent: Feb. 18, 2025

(54) SEMICONDUCTOR DEVICE

(71) Applicant: FUJI ELECTRIC CO., LTD., Kawasaki (JP)

(72) Inventor: Isao Saito, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 761 days.

(21) Appl. No.: 17/381,426

(22) Filed: Jul. 21, 2021

(65) Prior Publication Data

US 2021/0351177 A1 Nov. 11, 2021

Related U.S. Application Data

(63) Continuation of application No. PCT/JP2020/025212, filed on Jun. 26, 2020.

(30) Foreign Application Priority Data

Aug. 6, 2019 (JP) .................................. 2019-144555

(51) Int. Cl.
  *H01L 27/02* (2006.01)
  *H01L 23/528* (2006.01)
  *H01L 27/06* (2006.01)
  *H01L 29/78* (2006.01)

(52) U.S. Cl.
  CPC ...... *H01L 27/0629* (2013.01); *H01L 23/5286* (2013.01); *H01L 27/0222* (2013.01);
  (Continued)

(58) Field of Classification Search
  CPC ............. H01L 27/0629; H01L 23/5286; H01L 27/0222; H01L 27/0274; H01L 29/7805;
  (Continued)

(56) References Cited

U.S. PATENT DOCUMENTS

| 4,086,642 A | 4/1978 | Yoshida et al. |
| 5,105,251 A | 4/1992 | Nakayama |

(Continued)

FOREIGN PATENT DOCUMENTS

| CN | 101710700 A | 5/2010 |
| CN | 102957306 A | 3/2013 |

(Continued)

OTHER PUBLICATIONS

JP 2013150139 A English machine translation (Year: 2013).*

(Continued)

*Primary Examiner* — Eduardo A Rodela
(74) *Attorney, Agent, or Firm* — Rabin & Berdo, P.C.

(57) ABSTRACT

A semiconductor device including a first line configured to receive a power supply voltage, a second line configured to be coupled to a load of the semiconductor device, first and second metal-oxide-semiconductor (MOS) transistors coupled in series between the first line and the second line, each of the first and second MOS transistors having a drain electrode and a gate electrode, the drain electrode of the first MOS transistor being coupled to the drain electrode of the second MOS transistor, a third line coupled to the gate electrode of the first MOS transistor, and a fourth line coupled to the gate electrode of the second MOS transistor, the third and fourth lines being electrically separated from each other.

10 Claims, 9 Drawing Sheets

(52) U.S. Cl.
CPC ...... *H01L 27/0274* (2013.01); *H01L 29/7805* (2013.01); *H01L 29/7813* (2013.01)

(58) Field of Classification Search
CPC ......... H01L 29/7813; H01L 21/823475; H01L 21/823487; H01L 27/0255; H01L 27/088; H01L 27/0727; Y02E 60/10; H02M 1/08; H03K 17/04; H03K 17/687; H01M 10/42
See application file for complete search history.

(56) References Cited

U.S. PATENT DOCUMENTS

| | | | |
|---|---|---|---|
| 2006/0087781 A1 | 4/2006 | Ishizuka et al. | |
| 2013/0044528 A1 | 2/2013 | Kaneda | |
| 2015/0022248 A1 | 1/2015 | Fukami | |
| 2015/0155735 A1* | 6/2015 | Mori | H02J 7/00 320/107 |

FOREIGN PATENT DOCUMENTS

| | | |
|---|---|---|
| JP | S51-54778 A | 5/1976 |
| JP | S51-81578 A | 7/1976 |
| JP | S5181579 A | 7/1976 |
| JP | H04-63475 A | 2/1992 |
| JP | H06-348350 A | 12/1994 |
| JP | H07-184318 A | 7/1995 |
| JP | H11-178224 A | 7/1999 |
| JP | 2001-224135 A | 8/2001 |
| JP | 2006-217699 A | 8/2006 |
| JP | 2013-038908 A | 2/2013 |
| JP | 2013150139 A * | 8/2013 |

OTHER PUBLICATIONS

International Search Report for PCT/JP2020/025212, mailed on Sep. 8, 2020.
Japanese Office Action issued in the Japanese counterpart Patent Application No. 2021-537620 dated Mar. 8, 2022.
Chinese Office Action dated Sep. 2, 2024, in the counterpart Chinese patent application No. 202080011324.9.
Wang, Weidong et al., "Switching Response Time Analysis of Optical MOS Relay", The 9th National LED Industry Seminar and Academic Conference, Jun. 27, 2005.

* cited by examiner

SEMICONDUCTOR DEVICE

CROSS-REFERENCE TO RELATED APPLICATIONS

This is a continuation application of International Patent Application No. PCT/JP2020/025212 filed Jun. 26, 2020, which claims the benefit of priority to Japanese Patent Application No. 2019-144555 filed Aug. 6, 2019, the entire contents of each of which the entire contents of each of which are incorporated herein by reference.

BACKGROUND

Technical Field

The present disclosure relates to a semiconductor device.

Description of the Related Art

In a typical automobile, an electronic control unit (ECU) provided between a battery and a load such as a motor includes a switch to supply power from the battery to the load (for example, Japanese Patent Application Publication No. H07-184318).

For example, two metal-oxide-semiconductor (MOS) transistors (particularly, n-type metal-oxide-semiconductor (NMOS) transistors) sharing a common gate electrode may be used as such a switch to supply power to the load. However, since the gate capacitances of the two MOS transistors configuring the switch are large in general, a long switching period is needed to turn on and off the switch.

The present disclosure is directed to provision of a semiconductor device including a switch capable of shortening a switching period.

SUMMARY

An aspect of the present disclosure is a semiconductor device comprising: a first line configured to receive a power supply voltage; a second line configured to be coupled to a load of the semiconductor device; first and second metal-oxide-semiconductor (MOS) transistors coupled in series between the first line and the second line, each of the first and second MOS transistors having a drain electrode and a gate electrode, the drain electrode of the first MOS transistor being coupled to the drain electrode of the second MOS transistor; a third line coupled to the gate electrode of the first MOS transistor; and a fourth line coupled to the gate electrode of the second MOS transistor, the third and fourth lines being electrically separated from each other.

DETAILED DESCRIPTION

At least following matters will become apparent from the description of the present specification and the accompanying drawings.

Embodiment

Figure 1:
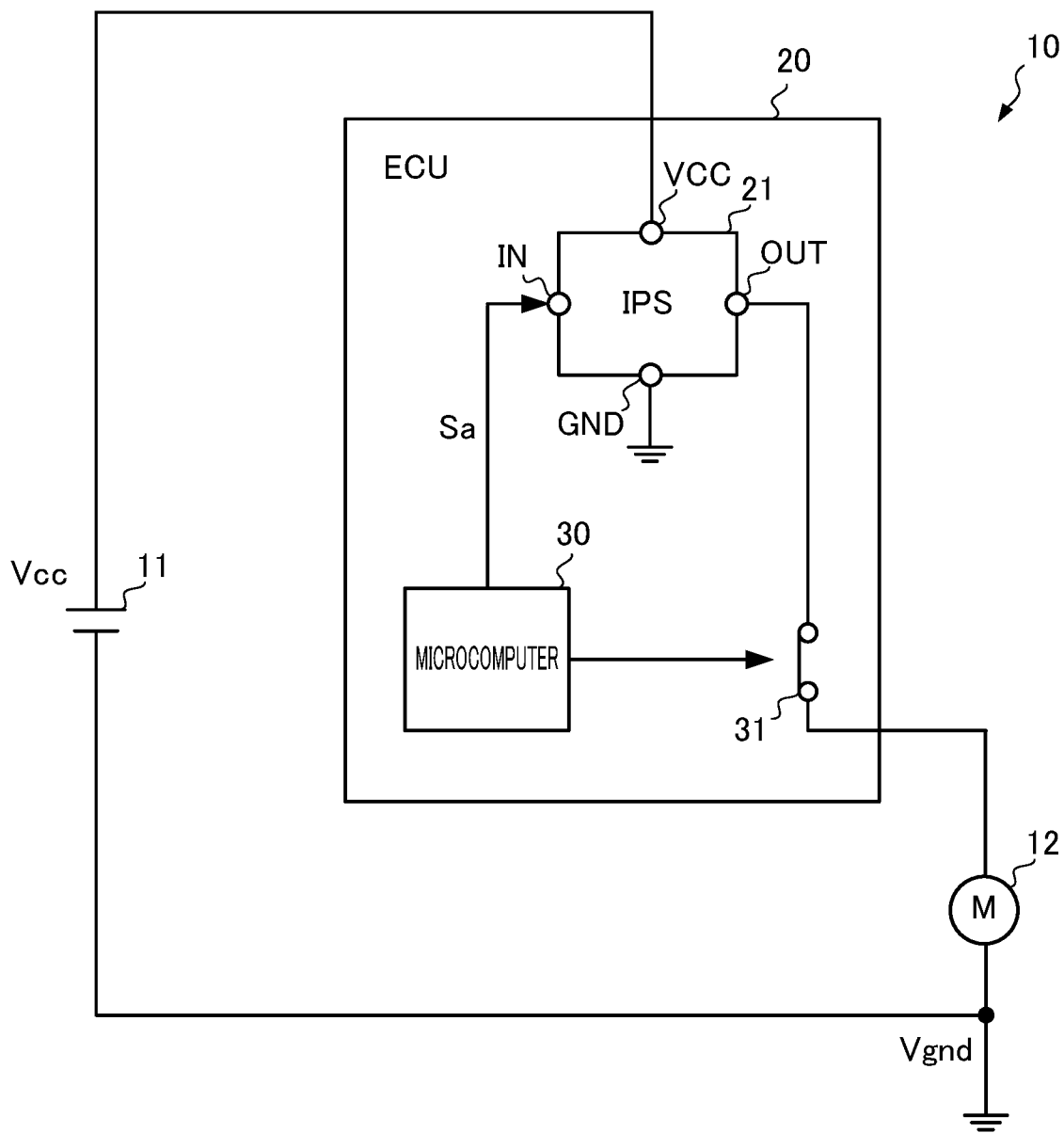
FIG. 1 is a diagram illustrating an example of a motor control device 10.

FIG. 1 is a diagram illustrating a configuration of a motor control device 10 according to an embodiment of the present disclosure. The motor control device 10 controls a motor 12 provided in an automobile with power from a battery 11, and comprises an ECU 20 including an intelligent power switch (IPS) 21. The battery 11 is, for example, a lithium-ion battery for automobiles, and outputs a power supply voltage Vcc of 12 V.

The ECU 20 is a device that controls the motor 12, and comprises the IPS 21 (described later), a microcomputer 30, and a switch 31.

The microcomputer 30 controls the IPS 21 and the switch 31 in response to an instruction (not illustrated) inputted from the outside. The switch 31 is an element that applies, to the motor 12, the power supply voltage Vcc of the battery 11 which is outputted through the IPS 21. Hereinafter, in an embodiment of the present disclosure, a description will be given assuming that the microcomputer 30 keeps the switch 31 on, for convenience.

The IPS 21 is a "semiconductor device" that switches between supplying the power supply voltage Vcc of the battery 11 and not supplying it to the motor 12 in response to an instruction signal Sa outputted from the microcomputer 30.

The IPS 21 includes terminals VCC, GND, IN, and OUT. The power supply voltage Vcc of the battery 11 is applied to the terminal VCC, and the terminal GND is grounded. The instruction signal Sa from the microcomputer 30 is inputted to the terminal IN, and the voltage Vcc is outputted from the terminal OUT upon turning on of a switch in the IPS 21 (described later). In an embodiment of the present disclosure, the voltage at the terminal GND is a ground voltage Vgnd (0 V).

In addition, as will be described later, the IPS 21 appropriately protects the motor 12 and the ECU 20 when the battery 11 is reversely coupled. The "reverse coupling" refers to a state in which the positive electrode of the battery 11 is coupled to a ground-side terminal (for example, the terminal GND), and the negative electrode of the battery 11 is coupled to a power-supply-side terminal (for example, the terminal VCC).

<<<Configuration of IPS 21>>>

Figure 2:
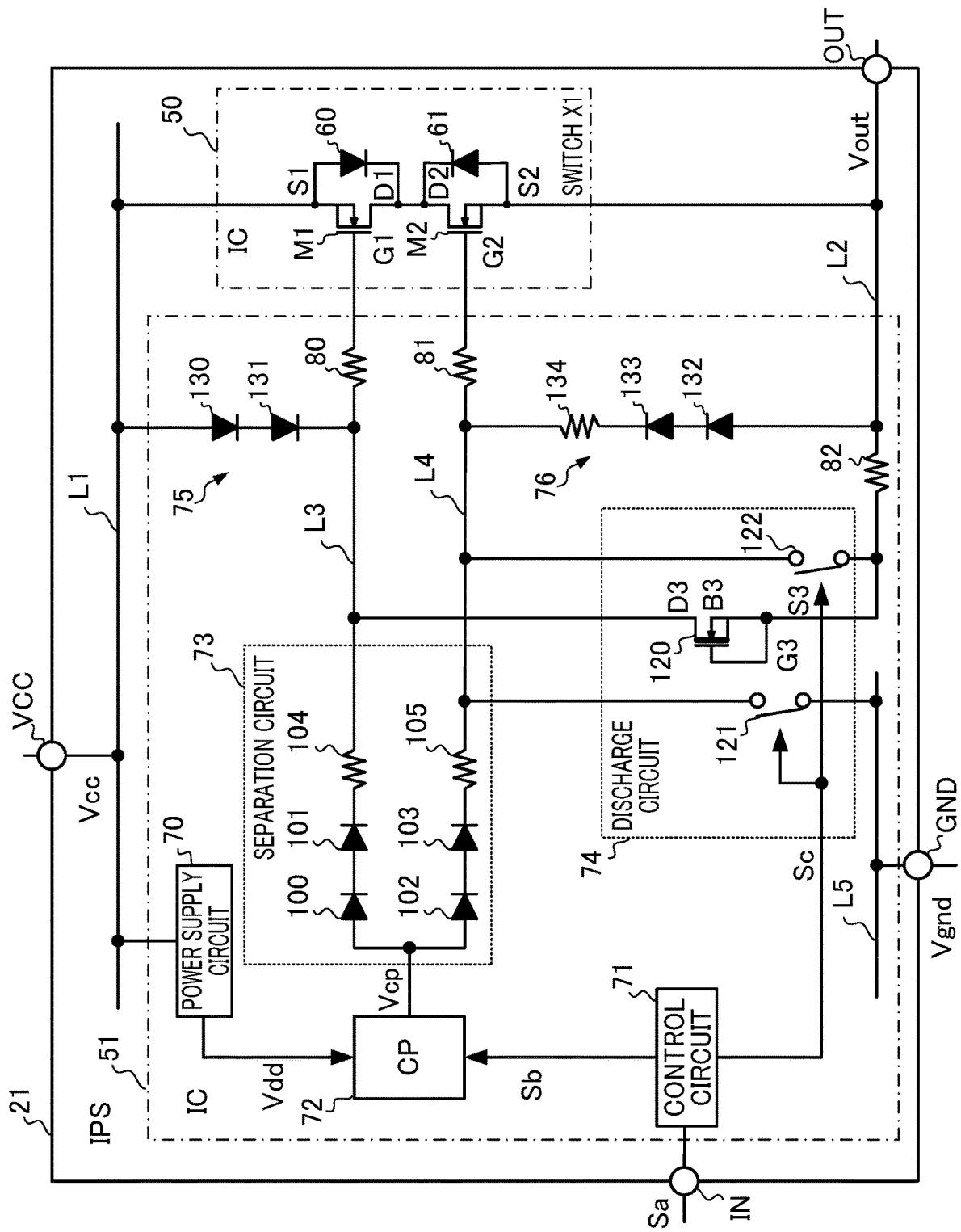
FIG. 2 is a diagram illustrating an example of an IPS 21.

FIG. 2 is a diagram illustrating an example of a configuration of the IPS 21. The IPS 21 comprises: an integrated circuit (IC) 50 in which the switch (described later) is formed; and an IC 51 including a circuit to turn on and off the switch.

===IC 50===

The IC 50 includes two metal-oxide-semiconductor (MOS) transistors configuring the switch (hereinafter, referred to as "switch X1") that switches between outputting the power supply voltage Vcc and not outputting it from the terminal OUT. Particularly, in an embodiment of the present disclosure, the two transistors are n-type metal-oxide-semiconductor (NMOS) transistors M1 and M2.

The NMOS transistor M1 has a source electrode S1 coupled to a "power supply line L1" to which the power supply voltage Vcc is applied. A diode 60 is formed as a body diode between the source electrode S1 and a drain electrode D1 of the NMOS transistor M1.

The NMOS transistor M2 has a source electrode S2 coupled to a "load line L2" to which a load such as the ECU 20 is coupled, and a drain electrode D2 coupled to the drain electrode D1 of the NMOS transistor M1. A diode 61 is formed as a body diode between the source electrode S2 and the drain electrode D2 of the NMOS transistor M2.

Here, the drain electrodes D1 and D2 of the NMOS transistors M1 and M2 are coupled in series. Thus, upon turning on of both the NMOS transistors M1 and M2, the power supply voltage Vcc at the terminal VCC is outputted from the terminal OUT.

The diode 60 has an anode coupled to the power supply line L1, and a cathode coupled to a cathode of the diode 61. The diode 61 has an anode coupled to the load line L2. Thus, the diodes 60 and 61 provided between the power supply line L1 and the load line L2 are coupled to each other with the cathodes thereof facing each other.

Accordingly, when both the NMOS transistors M1 and M2 are off, for example, the power supply voltage Vcc applied to the terminal VCC is interrupted by the diode 61. On the other hand, for example, when the battery 11 is reversely coupled, and the power supply voltage Vcc is applied to the terminal OUT, the power supply voltage Vcc at the terminal OUT is interrupted by the diode 60.

As a result, when both the NMOS transistors M1 and M2 are off, the "switch X1" can prevent the current from flowing through the load coupled to the terminal OUT, thereby appropriately protecting the load.

Note that the NMOS transistor M1 corresponds to a "first MOS transistor", and the NMOS transistor M2 corresponds to a "second MOS transistor". Further, the power supply line L1 corresponds to a "first line", and the load line L2 corresponds to a "second line".

==Configurations of NMOS Transistors M1 and M2==

Figure 3:
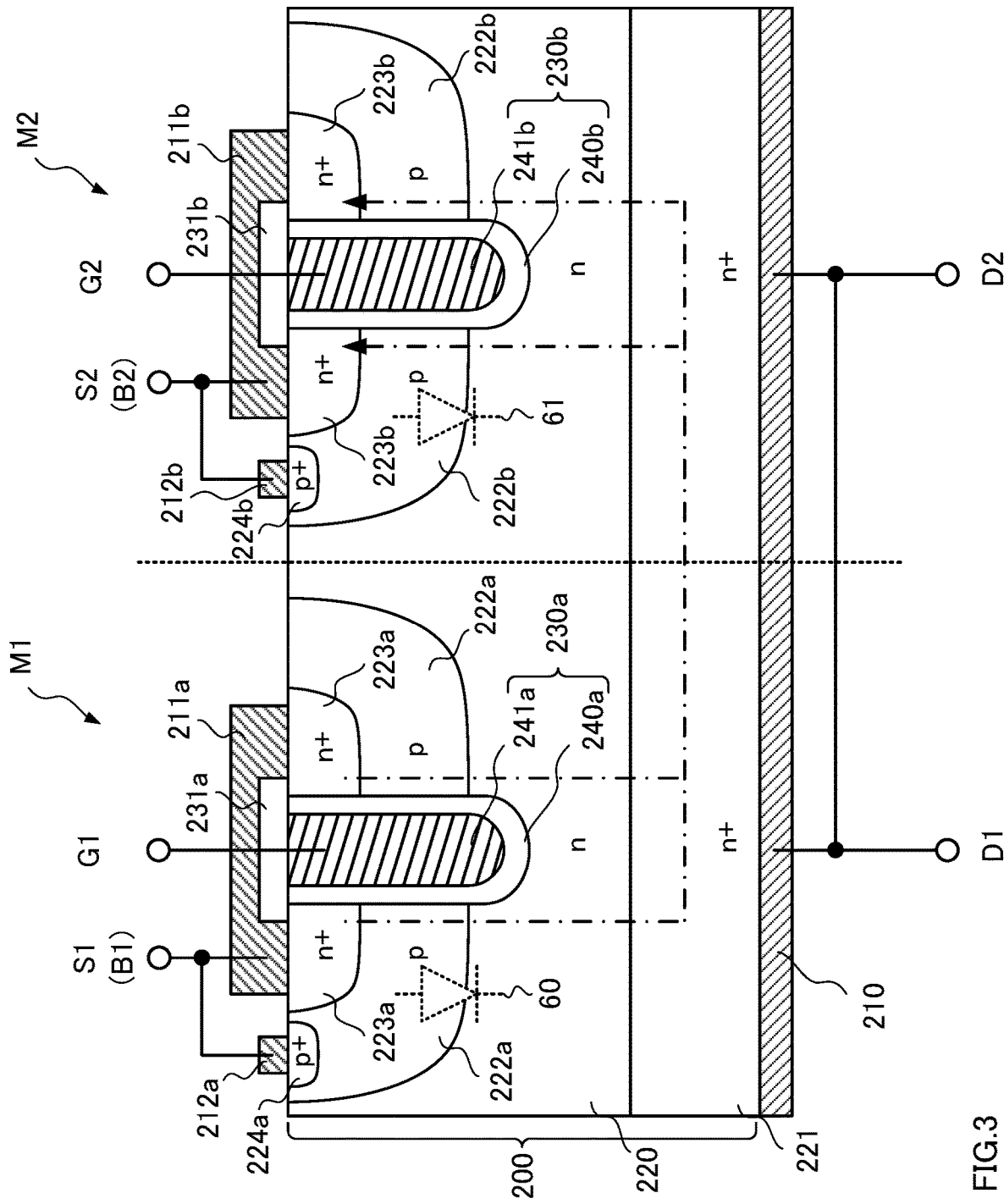
FIG. 3 is a cross-sectional view of NMOS transistors M1 and M2.

FIG. 3 is a cross-sectional view of the NMOS transistors M1 and M2. The NMOS transistors M1 and M2 are formed in a semiconductor substrate 200 of the IC 50.

The semiconductor substrate 200 is an n-type substrate made of silicon, for example, and a drain electrode 210 is formed on the back surface side of the semiconductor substrate 200, while source electrodes 211a and 211b and substrate electrodes 212a and 212b are formed on the front surface side thereof. Here, the drain electrode 210, the source electrodes 211a and 211b, and the substrate electrodes 212a and 212b may be made of a conductive material, such as polysilicon, or metallic electrodes, for example. Note that since the configurations of the NMOS transistors M1 and M2 are the same, only the NMOS transistor M1 will be described below.

Although the electrodes of the NMOS transistors M1 and M2 are given reference numerals different between FIGS. 2 and 3 for convenience, the drain electrode 210 of the NMOS transistor M1 corresponds to the "drain electrode D1", and a source electrode 211a corresponds to the "source electrode S1". Further, a gate electrode 241a (described later) corresponds to a "gate electrode G1".

In the semiconductor substrate 200, there are formed an n-type drift region 220, an n+ type drain region 221, a p-type well region 222a, an n+ type source region 223a, a p+ type contact region 224a, and a gate trench portion 230a.

The drift region 220 contains n-type impurity such as phosphorus, for example, and the drain region 221 contains a higher concentration of the n-type impurity such as phosphorus than the drift region 220, and is formed closer to the back surface side with respect to the drift region 220.

The well region 222a is formed closer to the front surface side with respect to the drift region 220, and the source region 223a is an n+ type region formed in a part of the well region 222a. Note that, hereinafter, a region referred to as n+ type or p+ type indicates that the region has a higher doping concentration than an n-type or p-type region. A p+ type contact region 224a containing a higher concentration of p-type impurity than the well region 222a is formed on the front surface side of the semiconductor substrate 200 in the well region 222a. The diode 60, which is a body diode, is formed between the p-type well region 222a and the n-type drift region 220.

The gate trench portion 230a comprises a gate oxide film 240a formed on a trench inner wall, and a gate electrode 241a covered with the gate oxide film 240a in the trench. The gate electrode 241a is made of a conductive material such as polysilicon. The gate trench portion 230a is covered with an oxide film 231a, and the source electrode 211a is formed on the front surface side of the oxide film 231a so as to cover the oxide film 231a.

Here, when the gate-source voltage of the NMOS transistor M1 and the gate-source voltage of the NMOS transistor M2 exceed threshold voltages thereof, respectively, channels are formed in the well regions 222a and 222b, thereby turning on the NMOS transistors M1 and M2.

As a result, for example, when the source electrode S1 of the NMOS transistor M1 is applied with the power supply voltage Vcc and the source electrode S2 of the NMOS transistor M2 results in the ground voltage, a current flows through a path given by dashed-dotted lines in FIG. 3.

Although a detailed description of the NMOS transistor M2 is omitted, the drain electrode 210 of the NMOS transistor M2 corresponds to the "drain electrode D2", and the source electrode 211b corresponds to the "source electrode S2". A gate electrode 241b corresponds to a "gate electrode G2".

===IC 51===

The IC 51 in FIG. 2 is a circuit to turn on and off the "switch X1" in response to the instruction signal Sa, and comprises a power supply circuit 70, a control circuit 71, a charge pump circuit 72, a separation circuit 73, a discharge circuit 74, gate protection circuits 75 and 76, and resistors 80 to 82.

The power supply circuit 70 generates a power supply voltage Vdd to operate circuits such as the control circuit 71 and the charge pump circuit 72 based on the power supply voltage Vcc from the battery 11. Note that the power supply voltage Vdd is a voltage lower than the power supply voltage Vcc.

The control circuit 71 is a logic circuit that generates an instruction signal Sb (first instruction signal) for turning on the "switch X1" and an instruction signal Sc (second instruction signal) for turning off the "switch X1", in response to the instruction signal Sa.

The charge pump circuit 72 generates a predetermined voltage Vcp (predetermined voltage) for turning on the NMOS transistors M1 and M2 that configure the "switch X1", in response to the instruction signal Sb. The charge pump circuit 72 will be described later in detail.

The separation circuit 73 applies a voltage corresponding to the voltage Vcp to two lines (described later) that are respectively coupled to the gate electrodes of the NMOS transistors M1 and M2, while the two lines are electrically separated from each other. The separation circuit 73 comprises diodes 100 to 103 and resistors 104 and 105.

The diode 100 has an anode to which the voltage Vcp is applied, and a cathode coupled to an anode of the diode 101. A cathode of the diode 101 is coupled to one end of the resistor 104, and the other end of the resistor 104 is coupled to a gate line L3.

The gate line L3 is a line coupled to the gate electrode G1 of the NMOS transistor M1 through the resistor 80.

Meanwhile, the diode 102 has an anode to which the voltage Vcp is applied, and a cathode coupled to an anode of the diode 103. A cathode of the diode 103 is coupled to one end of the resistor 105, and the other end of the resistor 105 is coupled to a gate line L4.

The gate line L4 is a line coupled to the gate electrode G2 of the NMOS transistor M2 through the resistor 81.

Thus, the diodes 100 and 101 and the resistor 104 coupled in series apply the voltage corresponding to the voltage Vcp to only the gate line L3 out of the gate lines L3 and L4. On the other hand, the diodes 102 and 103 and the resistor 105 coupled in series apply the voltage corresponding to the voltage Vcp to only the gate line L4 out of the gate lines L3 and L4. With the use of the separation circuit 73 as such, the voltage Vcp outputted from the single charge pump circuit 72 can be applied to each of the gate lines L3 and L4 that are provided to be electrically separated from each other.

Note that, in an embodiment of the present disclosure, two diodes are coupled to each of the gate lines L3 and L4, for example, however, another number (for example, one or three or more) of diodes may be coupled. Even when the power supply voltage Vcc becomes significantly high with an increase in number of the diodes in the separation circuit 73, it is possible to prevent the charge pump circuit 72 from being applied with a high voltage.

The gate line L3 may have any configuration as long as the gate line L3 is a "line to electrically couple" between the output from the separation circuit 73 and the gate electrode G1. Thus, the gate line L3 may not include the resistor 80. The same applies to the gate line L4 as in the gate line L3. Note that the gate line L3 corresponds to a "third line", and the gate line L4 corresponds to a "fourth line". Each of the diodes 100 and 101 correspond to a "first diode", and each of the diodes 102 and 103 correspond to a "second diode".

The discharge circuit 74 is a circuit to turn off the NMOS transistors M1 and M2 configuring the "switch X1", and comprises an NMOS transistor 120 and switches 121 and 122.

The NMOS transistor 120 is a depletion-type transistor, and has a drain electrode D3 coupled to the gate line L3, and a gate electrode G3 and a source electrode S3 that are coupled to the load line L2 through the resistor 82. Accordingly, the NMOS transistor 120 is kept on, and thus the gate capacitance of the NMOS transistor M1 is discharged through the NMOS transistor 120.

The current value in discharging the gate capacitance of the NMOS transistor M1 through the NMOS transistor 120 is set to a sufficiently small value so as not to have an influence on turning on of the NMOS transistor M1. The NMOS transistor 120 corresponds to a "third MOS transistor".

The switch 121 is provided between the gate line L4 and a ground line L5 coupled to the terminal GND, and the switch 122 is provided between the gate line L4 and the load line L2. The switches 121 and 122 are turned on in response to the instruction signal Sc for turning off the "switch X1", for example. Accordingly, the gate capacitance of the NMOS transistor M2 is discharged through a "path A1" including the gate line L4, the switch 121, and the ground line L5 and a "path A2" including the gate line L4, the switch 122, and the load line L2.

When the "switch X1" is on, a voltage corresponding to the power supply voltage Vcc is applied to the load line L2. Accordingly, the gate capacitance of the NMOS transistor M2 is first discharged through the "path A1". Here, the ground line L5 corresponds to a "fifth line", the switch 121 corresponds to a "first switch", and the switch 122 corresponds to a "second switch".

The gate protection circuit 75 prevents the voltage at the source electrode S1 from excessively exceeding the voltage at the gate electrode G1 in the NMOS transistor M1, and comprises diodes 130 and 131.

The diode 130 has an anode coupled to the power supply line L1, and a cathode coupled to an anode of the diode 131. A cathode of the diode 131 is coupled to the gate line L3. It is assumed that the forward voltage of each of the diodes 130 and 131 is Vf.

In such a case, upon the voltage at the source electrode S1 exceeding the voltage at the gate electrode G1 by more than the total of the forward voltages (2×Vf) of the two diodes 130 and 131, the diodes 130 and 131 are turned on. As a result, the gate protection circuit 75 can inhibit the source voltage of the NMOS transistor M1 from excessively exceeding the gate voltage. Accordingly, in an embodiment of the present disclosure, it is possible to prevent the gate oxide film 240a (see FIG. 3) of the NMOS transistor M1 from being damaged. Additionally, this causes the gate capacitance of the gate electrode G1 of the NMOS transistor M1 to be charged in advance, thereby exerting an effect of shortening the switching period.

The gate protection circuit 76 prevents the voltage at the source electrode S2 from excessively exceeding the voltage at the gate electrode G2 in the NMOS transistor M2, and comprises diodes 132 and 133 and a resistor 134. Note that when the battery 11 is normally coupled, the voltage at the source electrode S2 does not rise, however, when the battery 11 is reversely coupled, the voltage at the source electrode S2 rises.

The diode 132 has an anode coupled to the load line L2, and a cathode coupled to an anode of the diode 133. A cathode of the diode 133 is coupled to the gate line L4 through the resistor 134 for controlling a current. It is assumed that the forward voltage of each of the diodes 132 and 133 is Vf.

In such a case, upon the voltage at the source electrode S2 exceeding the voltage at the gate electrode G2 by more than the total of the forward voltages (2×Vf) of the two diodes 132 and 133, the diodes 132 and 133 are turned on. As a result, the gate protection circuit 76 can inhibit the source voltage of the NMOS transistor M2 from excessively exceeding the gate voltage. Accordingly, in an embodiment of the present disclosure, it is possible to prevent a gate oxide film 240b (see FIG. 3) of the NMOS transistor M2 from being damaged.

Note that each of the diodes 130 and 131 whose anode side is coupled to the power supply line L1 and whose cathode side is coupled to the gate line L3 corresponds to a "third diode". Further, each of the diodes 132 and 133 whose anode side is coupled to the load line L2 and whose cathode side is coupled to the gate line L4 corresponds to a "fourth diode".

==Configuration of Charge Pump Circuit 72==

Figure 4:
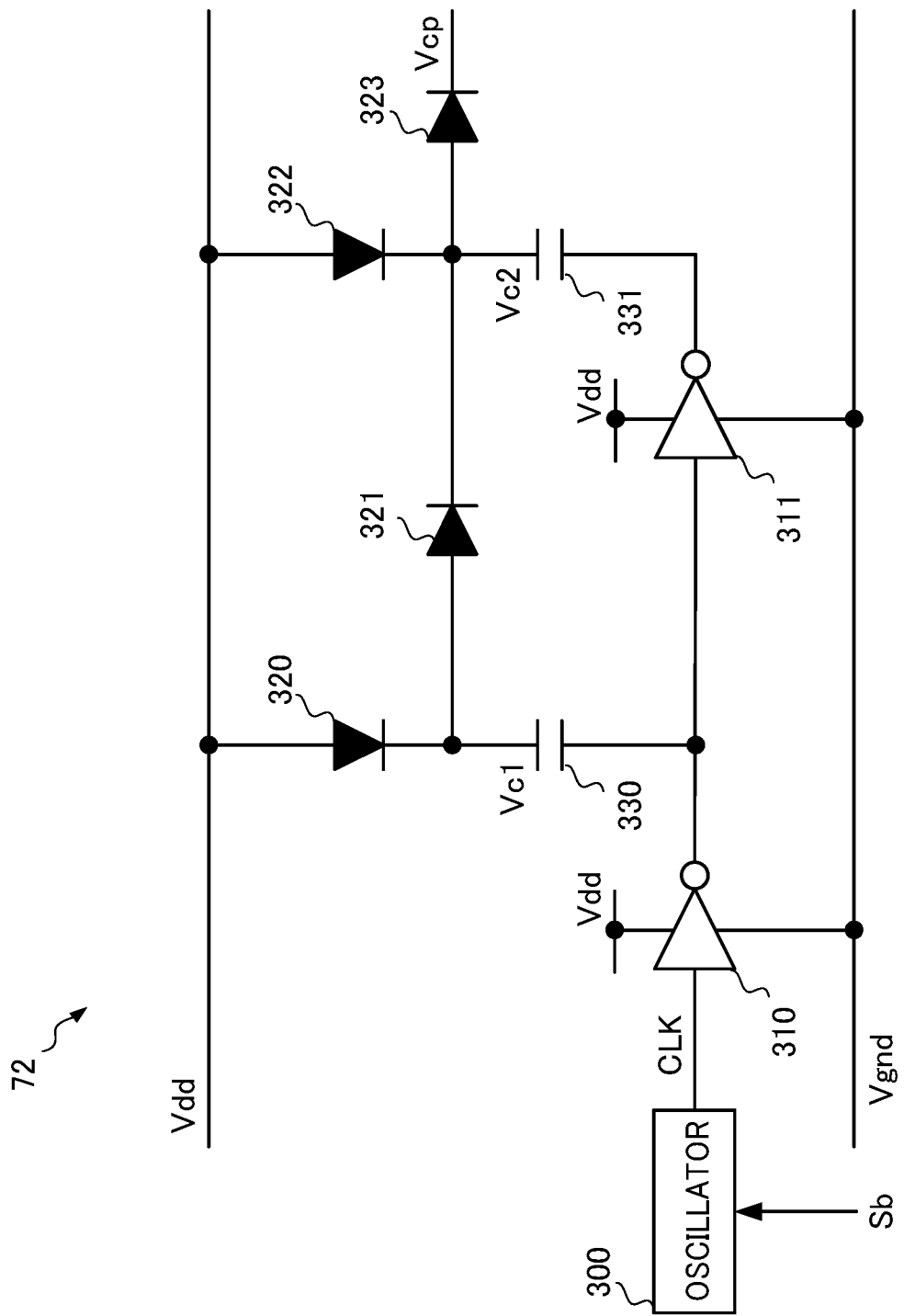
FIG. 4 is a diagram illustrating an example of a charge pump circuit 72.

FIG. 4 is a diagram illustrating an example of the charge pump circuit 72. The charge pump circuit 72 comprises an oscillator 300, inverters 310 and 311, diodes 320 to 323, and capacitors 330 and 331. It is assumed here that the forward voltage of each of the diodes 320 to 323 is "Vf".

The oscillator 300 is, for example, a circuit that outputs a clock signal CLK at a predetermined frequency in response to the instruction signal Sb for turning on the "switch X1". The inverters 310 and 311 each invert the logic level of a signal inputted thereto and output the resultant signal.

The inverter 310, the diode 320, and the capacitor 330 configure a boost circuit in a first stage of the charge pump circuit 72. The diode 320 has an anode to which the power supply voltage Vdd is applied, and a cathode coupled to one end of the capacitor 330. The other end of the capacitor 330 is coupled to an output of the inverter 310.

The inverter 311, the diodes 321 and 322, and the capacitor 331 configure a boost circuit in a second stage of the charge pump circuit 72.

The diode 321 has an anode coupled to the one end of the capacitor 330, and a cathode coupled to one end of the capacitor 331. The diode 322 has an anode to which the power supply voltage Vdd is applied, and a cathode coupled to the one end of the capacitor 331. The other end of the capacitor 331 is coupled to an output of the inverter 311.

A voltage Vc2 at the one end of the capacitor 331 of the boost circuit in the second stage is outputted as the voltage Vcp through the diode 323.

==Operation of Charge Pump Circuit 72==

Here, when the clock signal CLK is at a high level (hereinafter, referred to as high or high level), the output of the inverter 310 is at a low level (hereinafter, referred to as low or low level), and a voltage Vc1 at the one end of the capacitor 330 is charged through the diode 320. As a result, the voltage Vc1 at the one end of the capacitor 330 is given by Expression (1).

$$Vc1 = Vdd - Vf \quad (1)$$

Then, upon the clock signal going low, the output of the inverter 310 goes high (power supply voltage Vdd), and thus the voltage Vc1 at the one end of the capacitor 330 is given by Expression (2).

$$Vc1 = 2 \times Vdd - Vf \quad (2)$$

At this timing, the output of the inverter 311 is low, and thus the other end of the capacitor 331 is at the ground voltage Vgnd (0 V). As a result, the voltage Vc2 at the one end of the capacitor 331 is given by Expression (3).

$$Vc2 = 2 \times Vdd - 2 \times Vf \quad (3)$$

Furthermore, when the clock signal CLK goes high, the output of the inverter 311 goes high, and thus the voltage Vc2 at the one end of the capacitor 331 is given by Expression (4).

$$Vc2 = 3 \times Vdd - 2 \times Vf \quad (4)$$

Then, since a cathode of the diode 323 is coupled to the separation circuit 73, the voltage Vcp outputted from the diode 323 is given by Expression (5).

$$Vcp = 3 \times Vdd - 3 \times Vf \quad (5)$$

Note that the charge pump circuit 72 according to an embodiment of the present disclosure includes such a two-stage boost circuit, however, the configuration is not limited thereto. Any configuration can be applied as long as the voltage Vcp is capable of turning on the NMOS transistors M1 and M2.

<<<Operation of IPS 21>>>

The output voltage Vout of the IPS 21 upon turning on and off of the "switch X1" in the motor control device 10 in FIG. 1 will be described. Here, since the battery 11 is normally coupled, the power supply voltage Vcc is applied to the terminal VCC, and the ground voltage is applied to the terminal OUT through a coil (not illustrated) of the motor 12. In the charge pump circuit 72, the cycle of the clock signal CLK is set such that the charge pump circuit 72 generates a desired voltage Vcp within a sufficiently short period of time.

Figure 5:
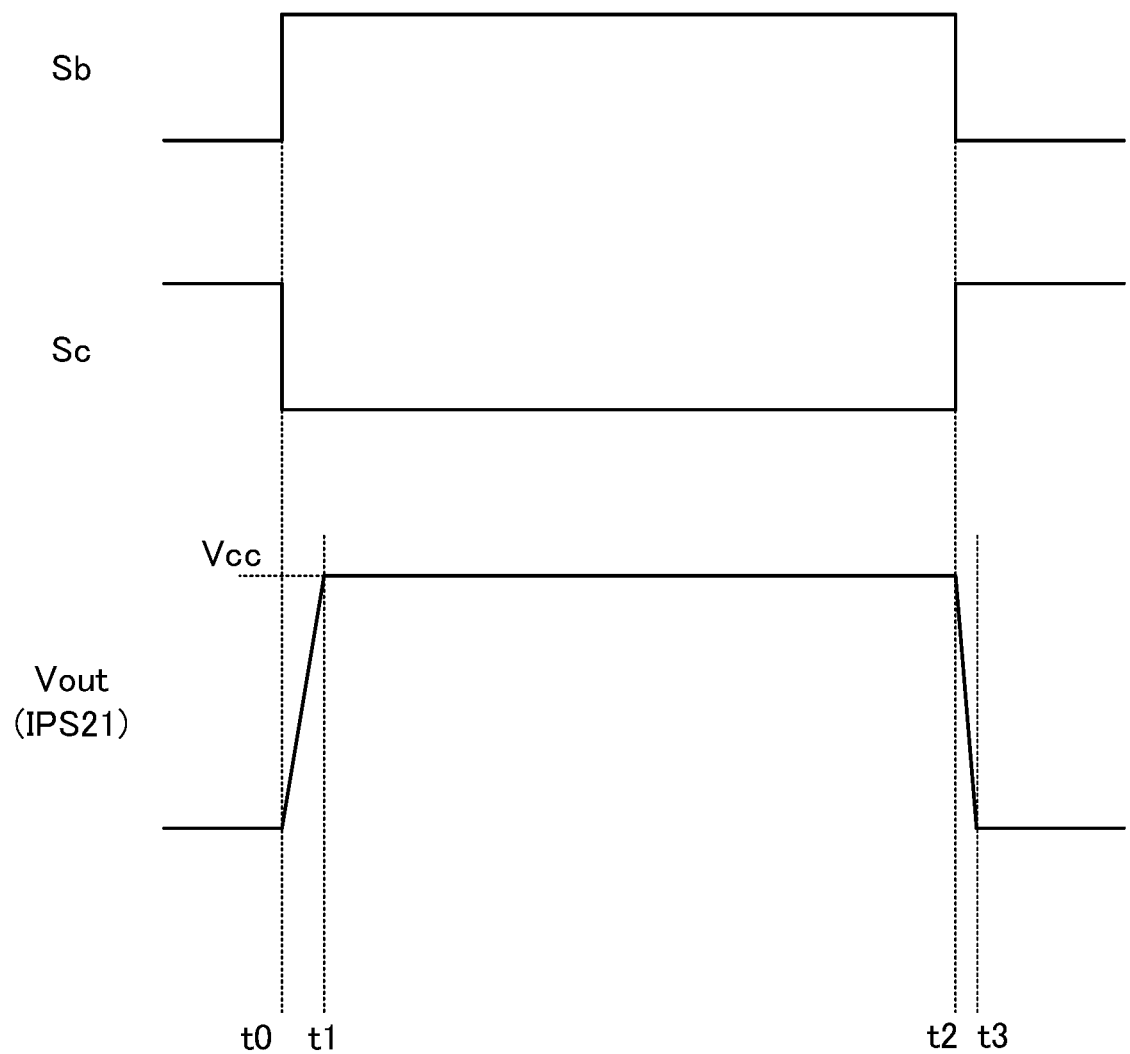
FIG. 5 is a diagram illustrating an example of change in an output voltage Vout of an IPS 21.

FIG. 5 is a diagram illustrating an example of change in the output voltage Vout of the IPS 21. It is assumed here that the high instruction signal Sb for turning on the "switch X1" is inputted at time t0. Before time t0, the high instruction signal Sc for turning off the "switch X1" is inputted. Accordingly, before time t0, the NMOS transistors M1 and M2 ("switch X1") are off due to the NMOS transistor 120 and the switches 121 and 122 that are on of the discharge circuit 74 in FIG. 2.

First, upon the instruction signal Sb going high and the instruction signal Sc going low, so as to turn on the "switch X1", at time t0, the charge pump circuit 72 outputs the voltage Vcp and the switches 121 and 122 are turned off.

Upon the charge pump circuit 72 outputting the voltage Vcp, the separation circuit 73 applies the voltage corresponding to the voltage Vcp to each of the gate lines L3 and L4. Here, the voltage at the source electrode S1 of the NMOS transistor M1 is the power supply voltage Vcc, and the voltage at the source electrode S2 of the NMOS transistor M2 is the ground voltage Vgnd (0 V). Accordingly, the NMOS transistor M2 out of the NMOS transistors M1 and M2 is turned on first.

Then, upon the voltage applied to the gate line L3 exceeding the power supply voltage Vcc, which is the voltage at the source electrode S1 of the NMOS transistor M1, by a threshold voltage of the NMOS transistor M1, the NMOS transistor M1 is turned on. As a result, at time t1 at which both the NMOS transistors M1 and M2 are on, the output voltage Vout rises to the power supply voltage Vcc. Here, a voltage drop and the like due to the on-resistances of the NMOS transistors M1 and M2 are not taken into consideration, for convenience.

Then, for example, upon the instruction signal Sb going low and the instruction signal Sc going high, so as to turn off the "switch X1", at time t2, the charge pump circuit 72 stops outputting the voltage Vcp, and the switches 121 and 122 are turned on.

Here, in an embodiment of the present disclosure, the current value in discharging the gate capacitance of the NMOS transistor M1 through the NMOS transistor 120 is set to a sufficiently small value so as not to have the influence on turning on of the NMOS transistor M1. On the other hand, the switches 121 and 122 are switches having sufficiently small on-resistances. Thus, the gate capacitance of the NMOS transistor M2 is discharged within a short period of time through the switches 121 and 122, and the NMOS transistor M2 is turned off immediately. When the NMOS transistor M2 is turned off, the power supply voltage Vcc is interrupted by the diode 61. As a result, for example, at time t3, the output voltage Vout drops to the ground voltage.

Accordingly, at time t3, although the NMOS transistor M1 is on, the "switch X1" provided between the terminal VCC and the terminal OUT is turned off because the NMOS transistor M2 is turned off.

In an embodiment of the present disclosure, the NMOS transistors M1 and M2 configuring the "switch X1" are driven by the electrically separated gate lines L3 and L4, respectively. Next, a period of time of change in the output voltage Vout is compared between a case of using the "switch X1" having the configuration as such and a case of using a "switch" including two NMOS transistors sharing a common gate electrode.

<<<Configuration of IPS 25 According to Comparative Example>>

Figure 6:
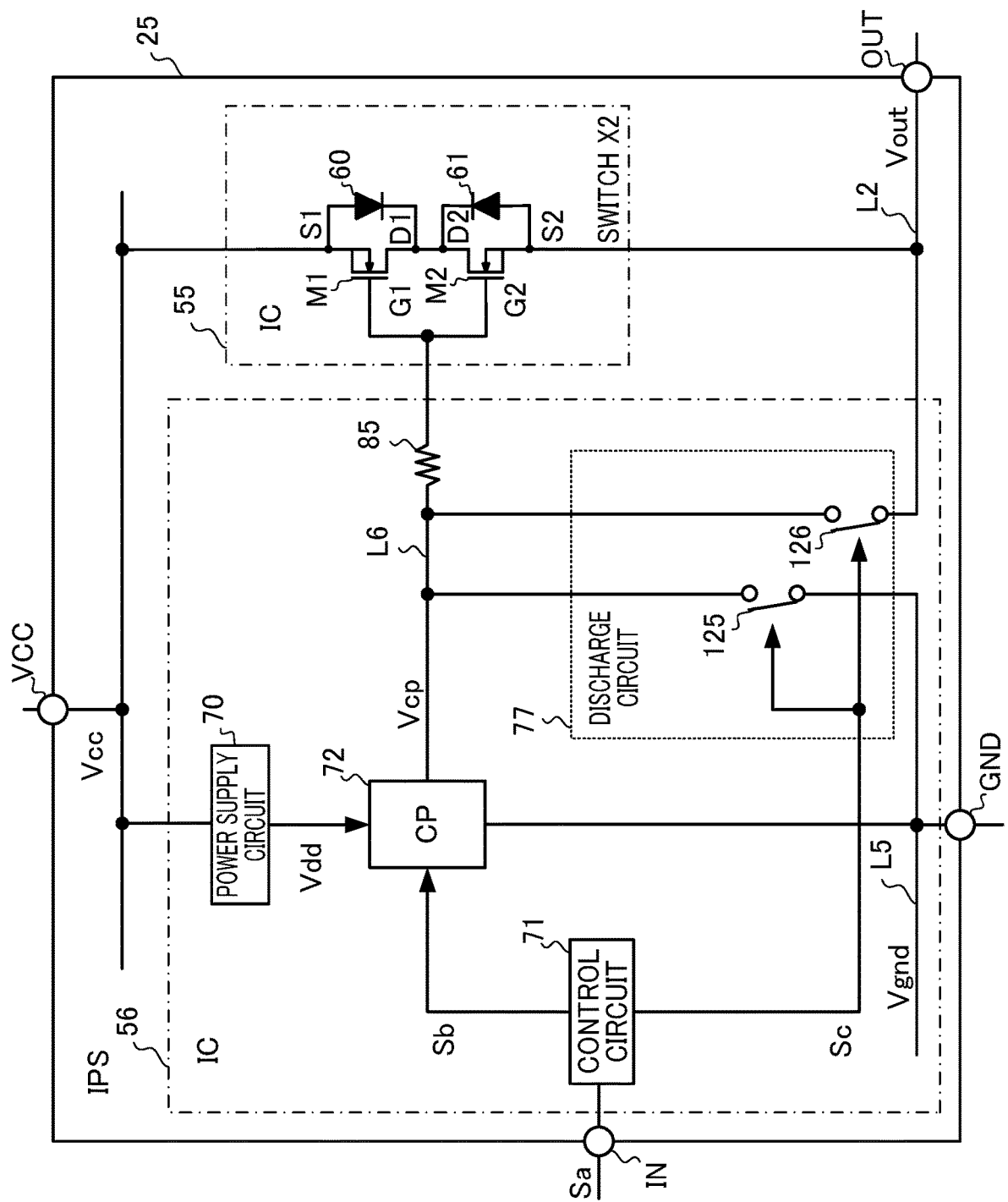
FIG. 6 is a diagram illustrating an example of an IPS 25.

FIG. 6 is a diagram illustrating an example of a configuration of an IPS 25 according to a comparative example. Similarly to the IPS 21, the IPS 25 comprises an IC 55 in which a switch (described later) is formed, and an IC 56 including a circuit to turn on and off the switch. Note that elements and blocks given the same reference numerals between the IPS 21 in FIG. 2 and the IPS 25 in FIG. 6 are the same.

Similarly to the IC 50, the IC 55 comprises the NMOS transistors M1 and M2. However, the gate electrodes G1 and G2 of the NMOS transistors M1 and M2 are coupled to each other. In the IC 55, the electrodes other than the gate electrodes G1 and G2 of the NMOS transistors M1 and M2 are coupled in the same manner as in the IC 50. Hereinafter, the switch configured with the NMOS transistors M1 and M2 in the IC 55 is referred to as "switch X2".

The IC 56 is a circuit to turn on and off the "switch X2", and comprises the power supply circuit 70, the control circuit 71, the charge pump circuit 72, a discharge circuit 77, and a resistor 85. Here, since the power supply circuit 70, the control circuit 71, and the charge pump circuit 72 of the IC 56 are the same as the blocks included in the IC 51, only the discharge circuit 77 and the resistor 85 will be described.

The discharge circuit 77 is a circuit to turn off the NMOS transistors M1 and M2 configuring the "switch X2", and comprises switches 125 and 126.

The switch 125 is provided between a gate line L6 coupled to the gate electrodes of the NMOS transistors M1 and M2 and the ground line L5 coupled to the terminal GND, and the switch 126 is provided between the gate line L6 and the load line L2.

The switches 125 and 126 are turned on in response to the instruction signal Sc for turning off the "switch X2", for example. Thus, the gate capacitances of the NMOS transistors M1 and M2 are discharged through a path including the gate line L6, the switch 125, and the ground line L5 and a path including the gate line L6, the switch 126, and the load line L2.

The resistor 85 is a gate resistor of the NMOS transistors M1 and M2, and has, for example, the same resistance value as that of each of the respective gate resistors of the NMOS transistors M1 and M2 of the IPS 21 in FIG. 2.

<<<Operation of IPS 25 According to Comparative Example>>>

Figure 7:
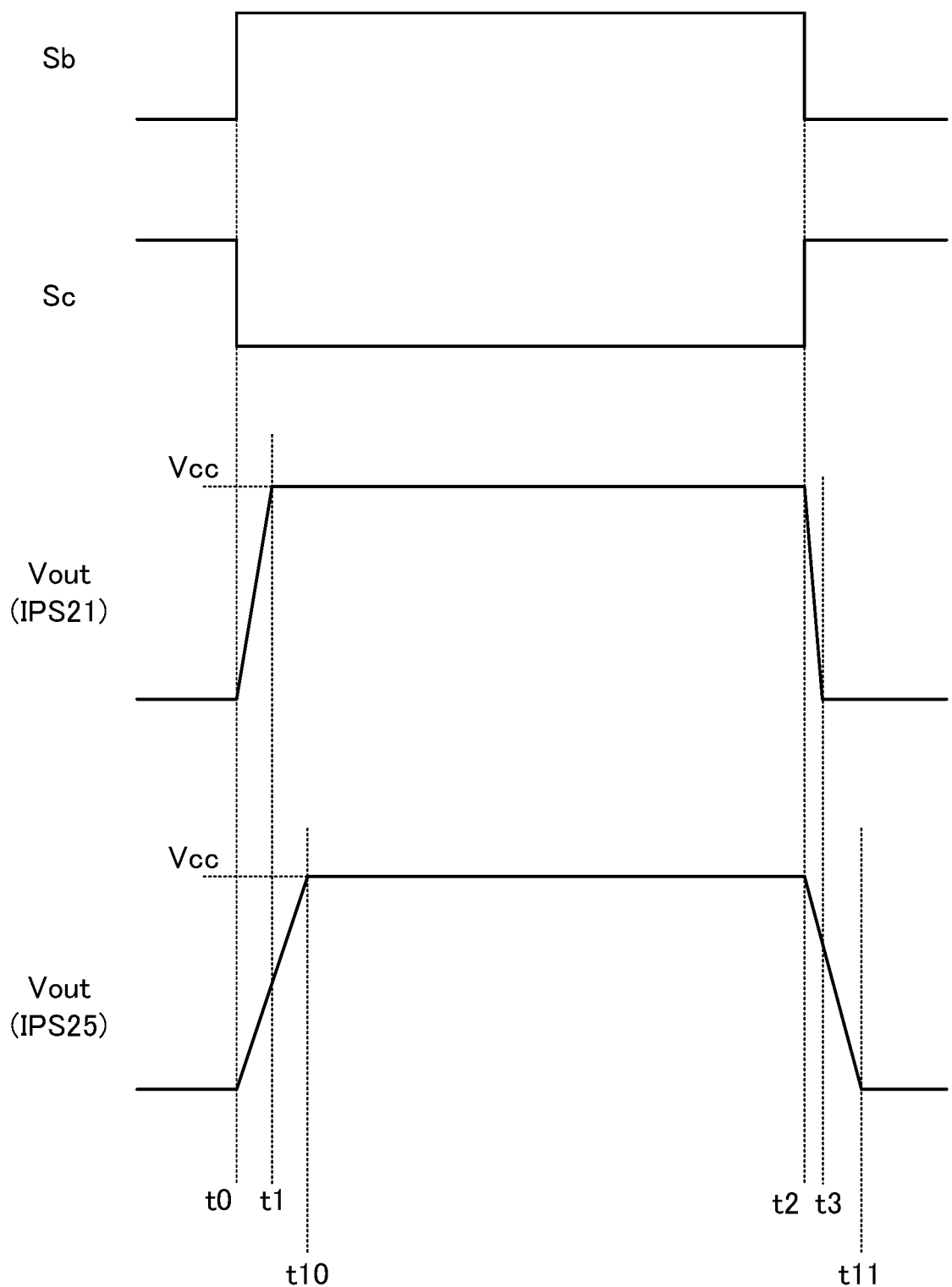
FIG. 7 is a diagram illustrating an example of change in output voltages Vout of IPSs 21 and 25.

FIG. 7 is a diagram illustrating an example of change in the output voltage Vout in the IPS 25. In FIG. 7, the waveform of the output voltage Vout of the IPS 21 illustrated in FIG. 5 is illustrated for comparison.

Here, as in FIG. 5, the high instruction signal Sb for turning on the "switch X1" is inputted at time to.

First, upon the instruction signal Sb going high and the instruction signal Sc going low, so as to turn on the "switch X2", at time t0, the charge pump circuit 72 outputs the voltage Vcp, and the switches 125 and 126 are turned off.

Upon the charge pump circuit 72 outputting the voltage Vcp, the voltage Vcp is applied to the gate line L6. Here, since the NMOS transistors M1 and M2 shares the common gate electrode, the charge pump circuit 72 needs to drive a greater capacitance as compared with the case of the "switch X1" of the IPS 21. As a result, the "switch X2" is turned on and the output voltage Vout rises to the power supply voltage Vcc at time t10 at a timing later than time t1 at which the "switch X1" is turned on as described above. As such, since the period of time from time t0 to time t1 is shorter than the period of time from time t0 to time t10, the IPS 21 can turn on the "switch X1" within a shorter period of time.

Upon the instruction signal Sb going low and the instruction signal Sc going high, so as to turn off the "switch X2", at time t2, for example, the charge pump circuit 72 stops outputting the voltage Vcp, and the switches 125 and 126 are turned on.

Here, although the switches 121 and 122 discharge the gate capacitance of only the NMOS transistor M2 in the IPS 21 in FIG. 2, the switches 125 and 126 of the IPS 25 in FIG. 6 need to discharge the gate capacitances of both the NMOS transistors M1 and M2. As a result, the "switch X2" is turned off, and the output voltage Vout drops to the ground voltage at time t11, which is later than time t3 at which the "switch X1" is turned off. As such, since the period of time from time t2 to time t3 is shorter than the period of time from time t2 to time t11, the IPS 21 can turn off the "switch X1" within a shorter period.

===Case where Battery 11 is Reversely Coupled===

Figure 8:
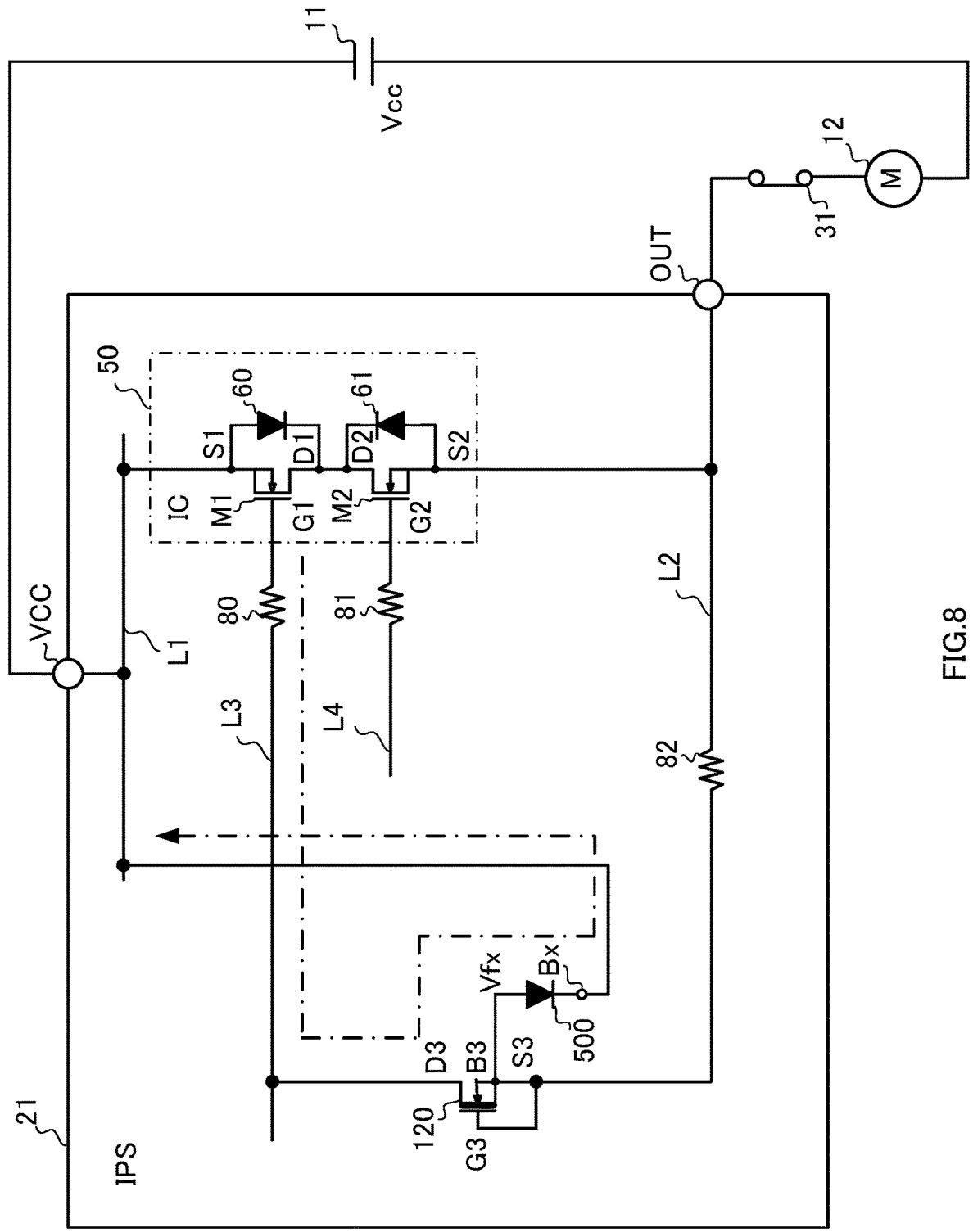
FIG. 8 is a diagram describing an operation of an IPS 21 when a battery 11 is reversely coupled.

FIG. 8 is a diagram for explaining an operation of the IPS 21 in a case where the battery 11 is reversely coupled. Note that, for convenience, FIG. 8 illustrates only some of the blocks of the IPS 21 in FIG. 2 that are related to the operation in the case of reversely coupling.

Figure 9:
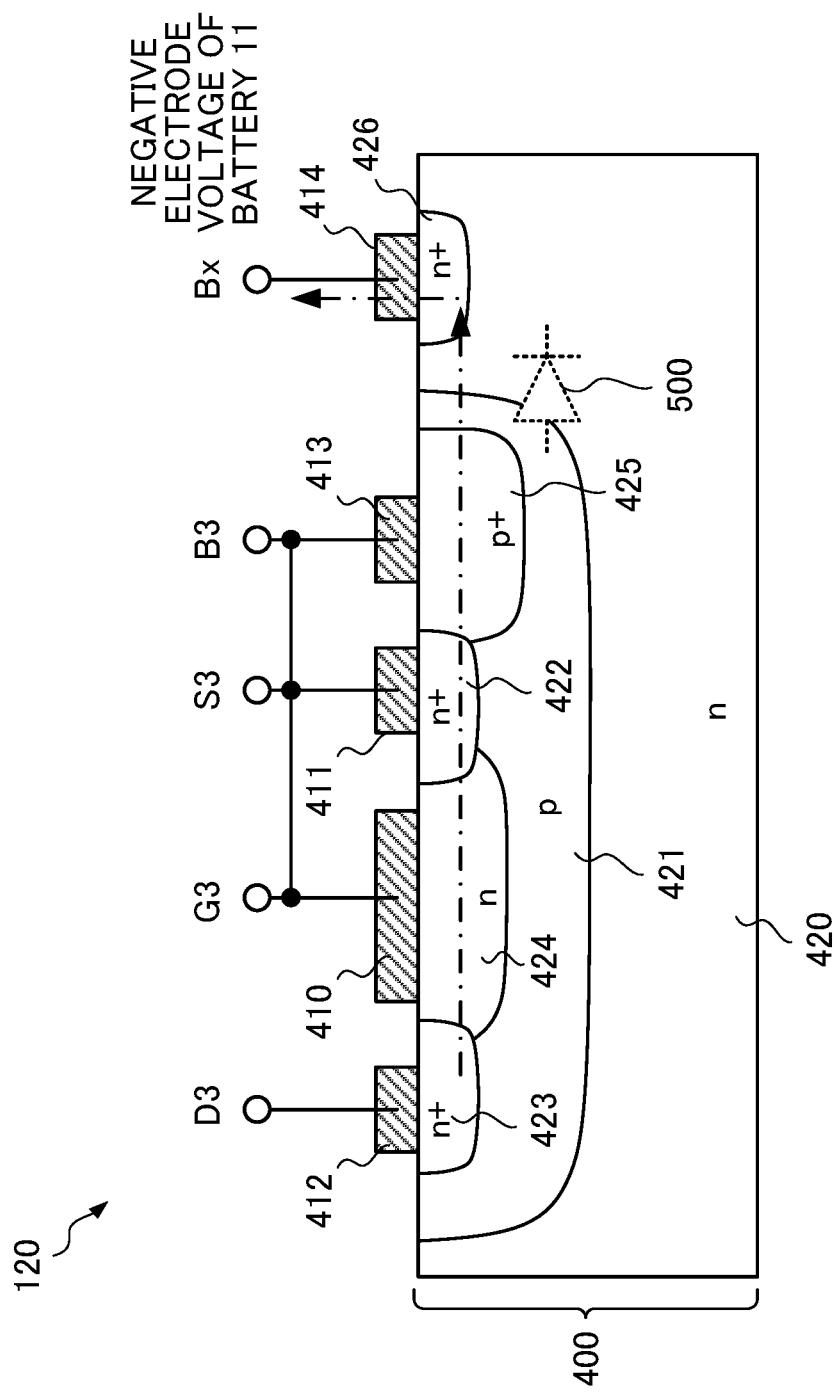
FIG. 9 is a cross-sectional view of an NMOS transistor 120.

FIG. 9 is a cross-sectional view of the NMOS transistor 120. The NMOS transistor 120 is formed in a semiconductor substrate 400 of the IC 51, and comprises a gate electrode 410, a source electrode 411, a drain electrode 412, and substrate electrodes 413 and 414 made of a conductive material, such as polysilicon.

The electrodes of the NMOS transistor 120 are given different reference numerals between FIGS. 2 and 8, and FIG. 9 for convenience, however, the gate electrode 410 of the NMOS transistor 120 corresponds to the "gate electrode G3", and the source electrode 411 corresponds to the "source electrode S3". The drain electrode 412 corresponds to the "drain electrode D3", and the substrate electrodes 413 and 414 correspond to a "substrate electrode B3" and a "substrate electrode Bx", respectively.

In the semiconductor substrate 400, there are formed an n-type drift region 420, a p-type well region 421, an n+ type source region 422, an n+ type drain region 423, an n-type gate region 424, a p+ type contact region 425, and an n+ type contact region 426.

The drift region 420 contains n-type impurity such as phosphorus, for example, and the well region 421 is a p-type region formed closer to the front surface side with respect to the drift region 420. Note that the drift region 420 corresponds to a "first region", and the well region 421 corresponds to a "second region".

The source region 422 and the drain region 423 are n+ type regions formed in parts of the well region 421, and the n-type gate region 424 is formed between the source region 422 and the drain region 423.

On the front surface side of the semiconductor substrate 400 in the well region 421, there is formed the contact region 425 containing a higher concentration of p-type impurity than the well region 421. A diode 500, which is a parasitic diode, is formed between the p-type well region 421 and the n-type drift region 420.

In addition, on the front surface side of the semiconductor substrate 400 in the n-type drift region 420, there is formed the contact region 426 containing a high concentration of n-type impurity.

In FIG. 8, when the battery 11 is reversely coupled, the power supply voltage Vcc of the positive electrode of the battery 11 is applied to the terminal OUT through the motor coil (not illustrated) of the motor 12 and the switch 31. On the other hand, the voltage of the negative electrode of the battery 11 is applied to the terminal VCC.

In such a state, the power supply voltage Vcc applied to the terminal OUT is applied to the source electrode S3, the gate electrode G3, and the substrate electrode B3 of the NMOS transistor 120 through the motor coil (not illustrated) of the motor 12, the load line L2, and the like.

Here, since the NMOS transistor 120 is formed in the n-type semiconductor substrate 400, the substrate electrode Bx of the n-type semiconductor substrate 400 is usually coupled to the power supply line L1 of the terminal VCC such that the power supply voltage Vcc, which is the highest potential, is applied thereto.

However, since the voltage of the negative electrode of the battery 11 is applied to the substrate electrode Bx when the battery 11 is reversely coupled, the diode 500 serving as the parasitic diode illustrated in FIG. 9 is turned on. As a result, the voltages at the source electrode S3, the gate electrode G3, and the substrate electrode B3 of the NMOS transistor 120 drop from the power supply voltage Vcc to a "forward voltage Vfx" of the diode 500.

As a result, for example, even when charges are accumulated in the gate capacitance of the NMOS transistor M1, the gate capacitance of the NMOS transistor M1 is discharged through the gate line L3 and the drain electrode D3, the diode 500, and the substrate electrode B3 of the NMOS transistor 120. In FIG. 8, a path through which the gate capacitance of the NMOS transistor M1 is discharged is given by a dashed-dotted line.

In an embodiment of the present disclosure, the threshold voltage of the NMOS transistor M1 is set higher than the "forward voltage Vfx" of the diode 500. Thus, with the gate of the NMOS transistor M1 being discharged through such a path, the NMOS transistor M1 is reliably turned off.

Accordingly, when the battery 11 is reversely coupled, the power supply voltage Vcc applied to the terminal OUT is outputted to the NMOS transistor M1 through the diode 61, but is interrupted by the NMOS transistor M1 that has been turned off. As a result, in an embodiment of the present disclosure, even when the battery 11 is reversely coupled, the IPS 21 can appropriately protect the motor 12 and the like.

===Summary===

The motor control device 10 according to an embodiment of the present disclosure has been described above. In an embodiment of the present disclosure, the gate lines L3 and L4 of the NMOS transistors M1 and M2 configuring the "switch X1" are electrically separated from each other. As a result, the switching period of the "switch X1" is shortened as illustrated in FIG. 7, for example.

In an embodiment of the present disclosure, the voltage Vcp is applied to the gate line L3 through the diodes 100 and 101, and is applied to the gate line L4 through the diodes 102 and 103. Thus, the voltage Vcp outputted from the single charge pump circuit 72 can be electrically separated and applied to the gate lines L3 and L4.

Further, for example, a charge pump circuit may be provided for each of the gate lines L3 and L4, however, such a configuration increases the circuit size. In an embodiment of the present disclosure, use of the separation circuit 73 makes it possible to apply the voltage to the gate lines L3 and L4 electrically separated from each other while keeping the circuit size small.

Further, since the diodes 130 and 131 according to an embodiment of the present disclosure can prevent the voltage at the source electrode S1 from excessively exceeding the gate electrode G1 of the NMOS transistor M1, it is possible to inhibit the gate oxide film of the NMOS transistor M1 from being damaged. Additionally, the diodes 130 and 131 exert an effect of charging the gate capacitance of the gate electrode G1 of the NMOS transistor M1 in advance before the switch X1 is turned on.

Further, since the diodes 132 and 133 according to an embodiment of the present disclosure can prevent the voltage at the source electrode S2 from excessively exceeding the voltage at the gate electrode G2 of the NMOS transistor M2, it is possible to inhibit the gate oxide film of the NMOS transistor M2 from being damaged.

Further, since the discharge circuit 74 discharges the gate capacitance of the NMOS transistor M2 in response to the instruction signal Sc, the NMOS transistor M2 is reliably turned off.

Further, for example, the switch 121 of the discharge circuit 74 discharges the gate capacitance of the NMOS transistor M2 to the ground line L5. Thus, the period of time during which the NMOS transistor M2 is off can be made shorter than that in the case of using only the switch 122, for example.

Further, the resistors 80 and 81 are provided to the gate lines L3 and L4, respectively, thereby reducing the noise occurring upon turning on of the NMOS transistors M1 and M2 is reduced.

Further, the gate capacitance of the NMOS transistor M1 is discharged by the depletion-type NMOS transistor 120. The NMOS transistor 120 is able to reliably turn off the NMOS transistor M1 without using a complicated circuit.

Further, the NMOS transistor 120 is, for example, formed in the p-type well region 421 formed in the n-type drift region 420. With such a configuration, the parasitic diode 500 of the NMOS transistor 120 is turned on when the battery 11 is reversely coupled. As a result, it is possible to discharge the gate capacitance of the NMOS transistor M1.

Further, in an embodiment of the present disclosure, the threshold voltage of the NMOS transistor M1 is greater than the "forward voltage Vfx" of the diode 500. Thus, when the gate capacitance of the NMOS transistor M1 is discharged through the diode 500, the NMOS transistor M1 is reliably turned off. This enables the IPS 21 to reliably protect the load even when the battery 11 is reversely coupled.

An Embodiment of the present disclosure described above is simply to facilitate understanding of the present disclosure and is not in any way to be construed as limiting the present disclosure. The present disclosure may variously be changed or altered without departing from its essential features and encompass equivalents thereof.

For example, in an embodiment of the present disclosure, the output voltage Vout of the IPS 21 is applied to the motor 12 serving as the load through the switch 31 of the ECU 20, however, it is not limited thereto. For example, the output voltage Vout of the IPS 21 may be directly applied to the motor 12.

Further, in an embodiment of the present disclosure, the IC 51 is an n-type semiconductor substrate, however, the IC 51 may be a p-type semiconductor substrate, for example. In a case where a p-type semiconductor substrate is used for the IC 51, the same effects can be achieved as in an embodiment of the present disclosure if a semiconductor device of a twin well or triple well structure is used so as to form the parasitic diode 500 in the NMOS transistor 120.

According to an embodiment of the present disclosure, it is possible to provide a semiconductor device including a switch capable of shortening a switching period.

What is claimed is:

1. A semiconductor device comprising:
   a first line configured to receive a power supply voltage;
   a second line configured to be coupled to a load of the semiconductor device;
   first and second metal-oxide-semiconductor (MOS) transistors coupled in series between the first line and the second line, each of the first and second MOS transistors having a drain electrode and a gate electrode, the drain electrode of the first MOS transistor being coupled to the drain electrode of the second MOS transistor;
   a third line coupled to the gate electrode of the first MOS transistor;
   a fourth line coupled to the gate electrode of the second MOS transistor, the third and fourth lines being electrically separated from each other;
   a charge pump circuit configured to output a predetermined voltage in response to a first instruction signal; and
   a separation circuit configured to receive the predetermined voltage from the charge pump circuit, and to apply the predetermined voltage to both the third line and the fourth line, but separately, to turn on the first and second MOS transistors.

2. The semiconductor device according to claim 1, wherein the separation circuit includes:
   a first diode coupled to the third line, and configured to apply the predetermined voltage to the third line; and
   a second diode coupled to the fourth line, and configured to apply the predetermined voltage to the fourth line.

3. The semiconductor device according to claim 1, further comprising:
   a third diode having an anode thereof coupled to the first line, and a cathode thereof coupled to the third line.

4. The semiconductor device according to claim 1, further comprising:
   a fourth diode having an anode thereof coupled to the second line, and a cathode thereof coupled to the fourth line.

5. The semiconductor device according to claim 1, further comprising:
   a discharge circuit coupled to the fourth line, and configured to discharge a gate capacitance of the second MOS transistor in response to a second instruction signal, received by the discharge circuit, for turning off of the second MOS transistor.

6. The semiconductor device according to claim 5, further comprising:
   a fifth line configured to be connected to ground, wherein the discharge circuit includes
      a first switch provided between the fourth line and the fifth line, the first switch being configured to be turned on in response to the second instruction signal, and
      a second switch provided between the fourth line and the second line, the second switch being configured to be turned on in response to the second instruction signal.

7. The semiconductor device according to claim 1, further comprising:
   a resistor provided in each of the third line and the fourth line.

8. A semiconductor device, comprising:
   a first line configured to receive a power supply voltage;
   a second line configured to be coupled to a load of the semiconductor device;
   first and second metal-oxide-semiconductor (MOS) transistors coupled in series between the first line and the second line, each of the first and second MOS transistors having a drain electrode and a gate electrode, the drain electrode of the first MOS transistor being coupled to the drain electrode of the second MOS transistor;
   a third line coupled to the gate electrode of the first MOS transistor;
   a fourth line coupled to the gate electrode of the second MOS transistor, the third and fourth lines being electrically separated from each other; and
   a third MOS transistor having
      a gate electrode and a source electrode that are coupled to the second line, and
      a drain electrode coupled to the third line, wherein
      the third MOS transistor is a depletion-type transistor.

9. The semiconductor device according to claim 8, wherein
   the third MOS transistor is an n-type metal-oxide-semiconductor (NMOS) transistor, and is formed in a semiconductor substrate including a first region of an n-type and a second region of a p-type that is formed in the first region, the third MOS transistor being formed in the second region.

10. The semiconductor device according to claim 9, wherein
   a threshold voltage of the first MOS transistor is greater than a forward voltage of a parasitic diode formed between the first and second regions of the semiconductor substrate.

* * * * *